US012660518B2

(12) United States Patent
Jeong et al.

(10) Patent No.: US 12,660,518 B2
(45) Date of Patent: Jun. 16, 2026

(54) SUBSTRATE PROCESSING APPARATUS AND METHOD OF MANUFACTURING SEMICONDUCTOR DEVICE USING THE SAME

(71) Applicant: Samsung Electronics Co., Ltd., Suwon-si (KR)

(72) Inventors: Geuno Jeong, Incheon (KR); Janghee Lee, Yongin-si (KR); Sungjoo An, Yongin-si (KR); Seran Oh, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 791 days.

(21) Appl. No.: 17/954,960

(22) Filed: Sep. 28, 2022

(65) Prior Publication Data

US 2023/0102650 A1 Mar. 30, 2023

(30) Foreign Application Priority Data

Sep. 29, 2021 (KR) ........................ 10-2021-0129099

(51) Int. Cl.
| | |
|---|---|
| *H01L 21/02* | (2006.01) |
| *C23C 16/02* | (2006.01) |
| *C23C 16/26* | (2006.01) |
| *C23C 16/455* | (2006.01) |
| *C23C 16/458* | (2006.01) |
| *C23C 16/46* | (2006.01) |
| *H10P 14/20* | (2026.01) |
| *H10P 72/76* | (2026.01) |

(52) U.S. Cl.
CPC ...... *H10P 14/3406* (2026.01); *C23C 16/0209* (2013.01); *C23C 16/0272* (2013.01);
(Continued)

(58) Field of Classification Search
CPC .............. C23C 16/46; C23C 16/45565; C23C 16/45563; C23C 16/45519; H01L 21/68771
See application file for complete search history.

(56) References Cited

U.S. PATENT DOCUMENTS

| | | | |
|---|---|---|---|
| 8,409,459 | B2 | 4/2013 | Denpoh et al. |
| 9,153,429 | B2 | 10/2015 | Ogawa |

(Continued)

FOREIGN PATENT DOCUMENTS

| | | |
|---|---|---|
| KR | 10-1999-0011464 A | 2/1999 |
| KR | 10-2014-0101049 A | 8/2014 |

(Continued)

OTHER PUBLICATIONS

Office Action in Korean Appln. No. 10-2021-0129099, mailed on Mar. 17, 2026, 23 pages (with English translation).

*Primary Examiner* — Joseph A Miller, Jr.

(74) *Attorney, Agent, or Firm* — Fish & Richardson P.C.

(57) ABSTRACT

A substrate processing apparatus includes: configured to support a plurality of substrates; a chamber sidewall surrounding at least a side surface of the substrate support; and an upper plate including a plurality of plate portions on the substrate support and spaced apart from the substrate support. The plurality of plate portions and the substrate support collectively at least partially define a plurality of process regions between the plurality of plate portions and the substrate support and a separation between at least two process regions of the plurality of process regions. The plurality of process regions include a pretreatment process region between the pretreatment process plate portion and the substrate support and having a first height, and a deposition process region between the deposition process plate portion and the substrate support and having a second height, greater than the first height.

18 Claims, 11 Drawing Sheets

(52) U.S. Cl.
　　CPC ........ *C23C 16/26* (2013.01); *C23C 16/45563*
　　　　　　(2013.01); *C23C 16/4583* (2013.01); *C23C*
　　　　　　*16/46* (2013.01); *H10P 14/36* (2026.01);
　　　　　　　　　　*H10P 72/7621* (2026.01)

(56)　　　　　　　References Cited

U.S. PATENT DOCUMENTS

| | | | |
|---|---|---|---|
| 2009/0120368 A1 | 5/2009 | Lubomirsky et al. | |
| 2010/0055316 A1* | 3/2010 | Honma | C23C 16/4401 |
| | | | 427/255.28 |
| 2010/0190341 A1* | 7/2010 | Park | H01L 21/02274 |
| | | | 156/345.33 |
| 2014/0024200 A1 | 1/2014 | Kato et al. | |
| 2015/0225848 A1 | 8/2015 | Han et al. | |
| 2017/0314129 A1* | 11/2017 | Karim | C23C 16/54 |
| 2021/0035780 A1 | 2/2021 | Oh et al. | |

FOREIGN PATENT DOCUMENTS

| | | | |
|---|---|---|---|
| KR | 101474364 | B1 | 12/2014 |
| KR | 10-2017-0076568 | A | 7/2017 |
| KR | 10-2020-0027665 | A | 3/2020 |
| KR | 10-2021-0100538 | A | 8/2021 |

* cited by examiner

I - I'

II - II'

III-III'

SUBSTRATE PROCESSING APPARATUS AND METHOD OF MANUFACTURING SEMICONDUCTOR DEVICE USING THE SAME

CROSS-REFERENCE TO RELATED APPLICATION

This application claims the benefit under 35 USC 119(a) of Korean Patent Application No. 10-2021-0129099 filed on Sep. 29, 2021 in the Korean Intellectual Property Office, the entire disclosure of which is incorporated herein by reference for all purposes.

BACKGROUND

The present inventive concepts relate to substrate processing apparatuses, substrate processing methods, and methods of manufacturing a semiconductor device using the same.

Semiconductor processes for manufacturing a semiconductor device may include a deposition process, a photolithography process, an etching process and the like, and these semiconductor processes may be performed using various substrate processing apparatuses. Recently, research into applying a graphene layer to the semiconductor device is being conducted. However, it may be difficult to form a high-quality graphene layer using a conventional substrate processing apparatus, and it may thus be difficult to apply the graphene layer to the semiconductor device.

SUMMARY

Some example embodiments provide a substrate processing apparatus including process regions having different heights and a substrate processing method using the same.

Some example embodiments provide a method of manufacturing a semiconductor device using the substrate processing apparatus and the substrate processing method.

According to some example embodiments, a substrate processing apparatus may include: a substrate support configured to support a plurality of substrates such that the plurality of substrates is on the substrate support; a chamber sidewall surrounding at least a side surface of the substrate support; and an upper plate including a plurality of plate portions on and spaced apart from the substrate support. The plurality of plate portions and the substrate support may collectively at least partially define a plurality of process regions between the plurality of plate portions and the substrate support. The plurality of plate portions and the substrate support may collectively at least partially define a separation between at least two process regions of the plurality of process regions. The plurality of plate portions may include a first pretreatment process plate portion and a first deposition process plate portion. The plurality of plate portions and the substrate support may collectively at least partially define the plurality of process regions to include a first pretreatment process region between the first pretreatment process plate portion and the substrate support and having a first height, and a first deposition process region between the first deposition process plate portion and the substrate support and having a second height that is greater than the first height. The first pretreatment process plate portion may include a pretreatment process gas nozzle configured to inject a pretreatment process gas to pre-treat a first substrate of the plurality of substrates on the substrate support in the first pretreatment process region, and the first deposition process plate portion may include a first deposition process gas nozzle configured to inject a deposition process gas to deposit a material layer on a second substrate of the plurality of substrates on the substrate support in the first deposition process region.

According to some example embodiments, a substrate processing apparatus may include: a substrate support configured to support a plurality of substrates such that the plurality of substrates is on the substrate support; a chamber sidewall surrounding at least a side surface of the substrate support; and an upper plate including a pretreatment process plate portion and a deposition process plate portion, wherein the upper plate is on the substrate support and spaced apart from the substrate support. The upper plate and the substrate support may collectively at least partially define a plurality of process regions between the upper plate and the substrate support. The upper plate and the substrate support may collectively at least partially define a separation between at least two process regions of the plurality of process regions. The upper plate and the substrate support may collectively at least partially define the plurality of process regions to include a pretreatment process region between the pretreatment process plate portion and the substrate support and having a first height, and a deposition process region between the deposition process plate portion and the substrate support and having a second height that is greater than the first height, the first height may be in a range of about 10 mm to about 50 mm, and the second height may be in a range of about 100 mm to about 200 mm.

According to some example embodiments, a method of manufacturing a semiconductor device may include: preparing a substrate processing apparatus including at least one annealing process region, at least one pretreatment process region having a first height, and at least one deposition process region having a second height that is greater than the first height; loading a plurality of substrates onto a substrate support in the substrate processing apparatus; forming a material layer on each of the plurality of substrates while moving respective positions of the plurality of substrates in the substrate processing apparatus; and unloading the plurality of substrates on each of which the material layer is formed from the substrate processing apparatus, wherein the forming of the material layer on each of the plurality of substrates includes: heat-treating at least one first substrate of the plurality of substrates in the at least one annealing process region to form a heat-treated at least one first substrate; moving the heat-treated at least one first substrate to the at least one pretreatment process region; pre-treating the heat-treated at least one first substrate in the at least one pretreatment process region to form a pre-treated at least one first substrate; moving the pre-treated at least one first substrate to the at least one deposition process region; and forming the material layer on the pre-treated at least one first substrate in the at least one deposition process region to form at least one first substrate on which the material layer is formed.

BRIEF DESCRIPTION OF THE DRAWINGS

The above and other aspects, features, and advantages of the present inventive concepts will be more clearly understood from the following detailed description, taken in conjunction with the accompanying drawings, in which.

DETAILED DESCRIPTION

Figure 1:
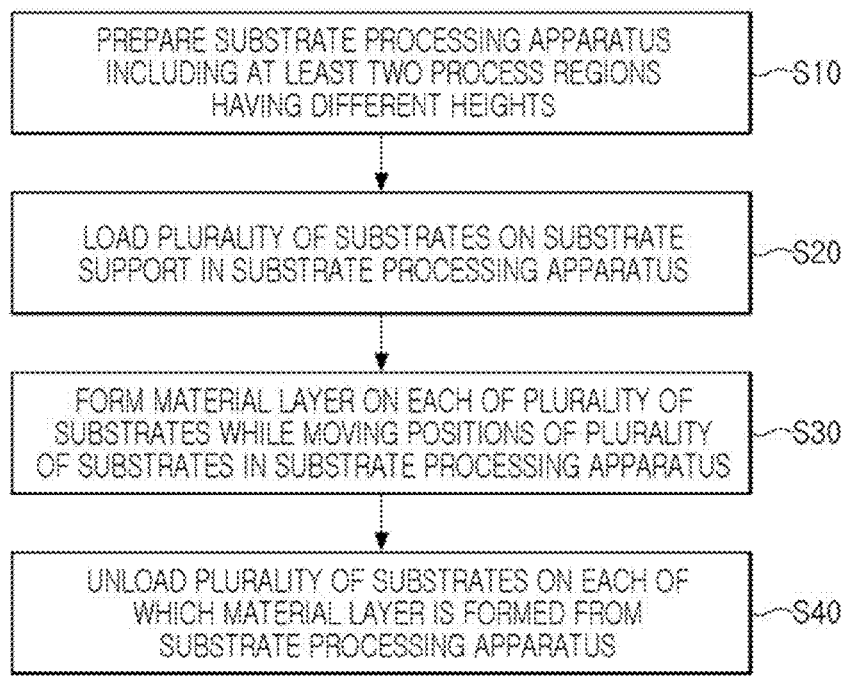
FIG. 1 is a flowchart illustrating a substrate processing method using a substrate processing apparatus according to some example embodiments of the present inventive concepts.

Hereinafter, some example embodiments will be described with reference to the accompanying drawings. In the description of FIGS. 1 to 16, the same reference numerals are used for substantially the same components, and duplicate descriptions of the corresponding components will be omitted. Also, similar reference numerals are used for similar components throughout various drawings of the present inventive concepts.

It will be understood that when an element such as a layer, film, region, or substrate is referred to as being "on" another element, it may be directly on the other element or intervening elements may also be present. For example, when an element is on another element and intervening elements are present, the element may be on and further spaced apart from (e.g., isolated from direct contact with) the other element, also referred to as being "indirectly" on the other element. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

As described herein, when an operation is described to be performed "by" performing additional operations, it will be understood that the operation may be performed "based on" the additional operations, which may include performing said additional operations alone or in combination with other further additional operations.

First, the description describes a substrate processing method using a substrate processing apparatus according to some example embodiments of the present inventive concepts with reference to FIG. 1.

FIG. 1 is a flowchart illustrating the substrate processing method using a substrate processing apparatus according to some example embodiments of the present inventive concepts.

Referring to FIG. 1, the substrate processing apparatus including at least two process regions having different heights may be prepared (S10). The at least two process regions may include at least one pretreatment process region and at least one deposition process region. The deposition process region may have a height greater than the pretreatment process region. A plurality of substrates may be loaded on a substrate support in the substrate processing apparatus (S20). The plurality of substrates may be semiconductor wafers on which a semiconductor process is already performed.

A material layer may be formed on each of the plurality of substrates while the positions of the plurality of substrates are moved in the substrate processing apparatus (S30). In some example embodiments, the material layer may be a graphene-like carbon material layer. For example, the material layer may be a graphene layer. A material of the material layer may be single layer graphene, multi-layer graphene, graphitic carbon, or graphite. The plurality of substrates on each of which the material layer is formed may be unloaded from the substrate processing apparatus (S40).

Figure 2:
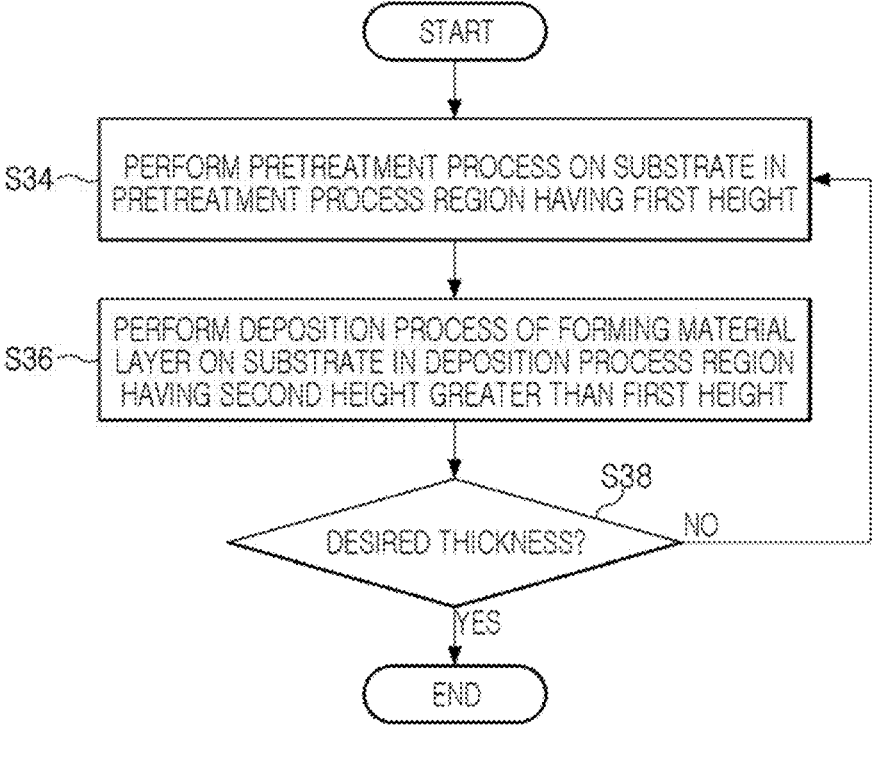
FIG. 2 is a flowchart illustrating an example of the substrate processing method according to some example embodiments of the present inventive concepts.

The description describes an example of a method of forming the material layer on each of the plurality of substrates in the substrate processing apparatus with reference to FIG. 2.

FIG. 2 is a flowchart illustrating an example of the substrate processing method according to some example embodiments of the present inventive concepts, and may illustrate the method of forming the material layer on one substrate in one substrate processing apparatus.

Referring to FIG. 2, a pretreatment process may be performed on the substrate in the pretreatment process region having a first height (S34). A deposition process of forming the material layer on the substrate may be performed in a deposition process region having a second height, greater than the first height (S36).

In some example embodiments, the pretreatment process may be a process of removing oxides formed on a surface of the substrate.

In some example embodiments, the material layer formed by the deposition process may be a graphene-like carbon material layer. For example, the material layer may be a graphene layer. A material of the material layer may be single layer graphene, multi-layer graphene, graphitic carbon, or graphite.

After performing the deposition process of forming the material layer on the substrate in the deposition process region, when the material layer is formed to have a desired thickness, the process of forming the material layer on the substrate may be completed.

After performing the deposition process of forming the material layer on the substrate in the deposition process region, when the material layer is not formed to have the desired thickness (S38=NO), repeat the performing of the pretreatment process on the substrate in the pretreatment process region (S34) and the performing of the deposition process of forming the material layer on the substrate in the deposition process region (S36) may be repeated. The performing of the pretreatment process on the substrate in the pretreatment process region (S34) and the performing of the deposition process of forming the material layer on the substrate in the deposition process region (S36) may be included in one process cycle. Accordingly, the one process cycle (S34 and S36) may be repeated until the material layer is formed to have the desired thickness (S38=YES).

Next, referring to FIG. 3, the description describes another example of the method of forming the material layer on each of the plurality of substrates in the substrate processing apparatus described with reference to FIG. 1.

Figure 3:
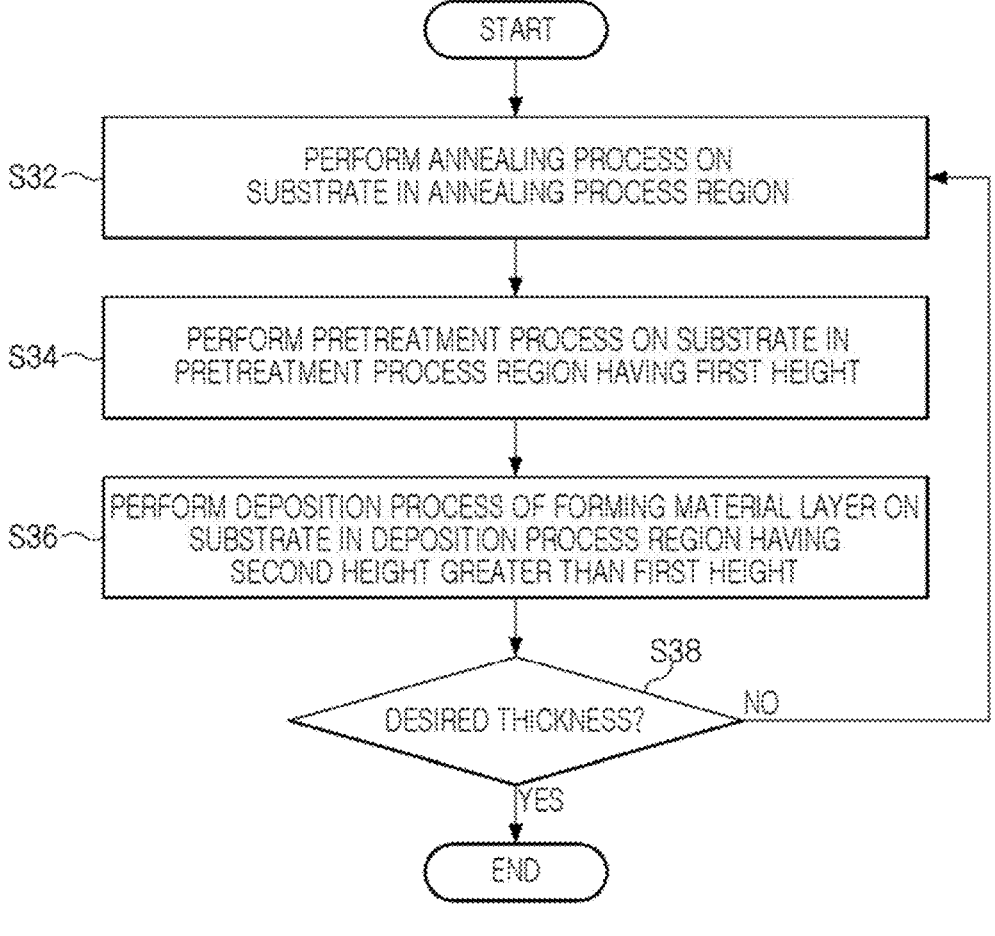
FIG. 3 is a flowchart illustrating another example of the substrate processing method according to some example embodiments of the present inventive concepts.

FIG. 3 is a flowchart illustrating another example of the substrate processing method according to some example embodiments of the present inventive concepts, and may illustrate another method of forming the material layer on one substrate in one substrate processing apparatus.

Referring to FIG. 3, before the performing of the pretreatment process on the substrate in the pretreatment process region described in FIG. 2 (S34), an annealing process may be performed on the substrate in an annealing process region (S32). Accordingly, the performing of the annealing process on the substrate in the annealing process region (S32), the performing of the pretreatment process on the substrate in the pretreatment process region (S34) and the performing of the deposition process of forming the material layer on the substrate in the deposition process region (S36), described with reference to FIG. 2, may all be included in one process cycle. Accordingly, after the performing of the deposition process of forming the material layer on the substrate in the deposition process region (S36), when the material layer is formed to have the desired thickness (S38=YES), the process may be completed. However, when the material layer is not formed to have the desired thickness (S38=NO), the one process cycle (S32, S34, S36, and S38) may be repeated until the material layer is formed to have the desired thickness.

Next, referring to FIGS. 4, 5, 6, and 7, the description describes an example of the substrate processing apparatus described with reference to FIGS. 1 to 3.

Figure 4:
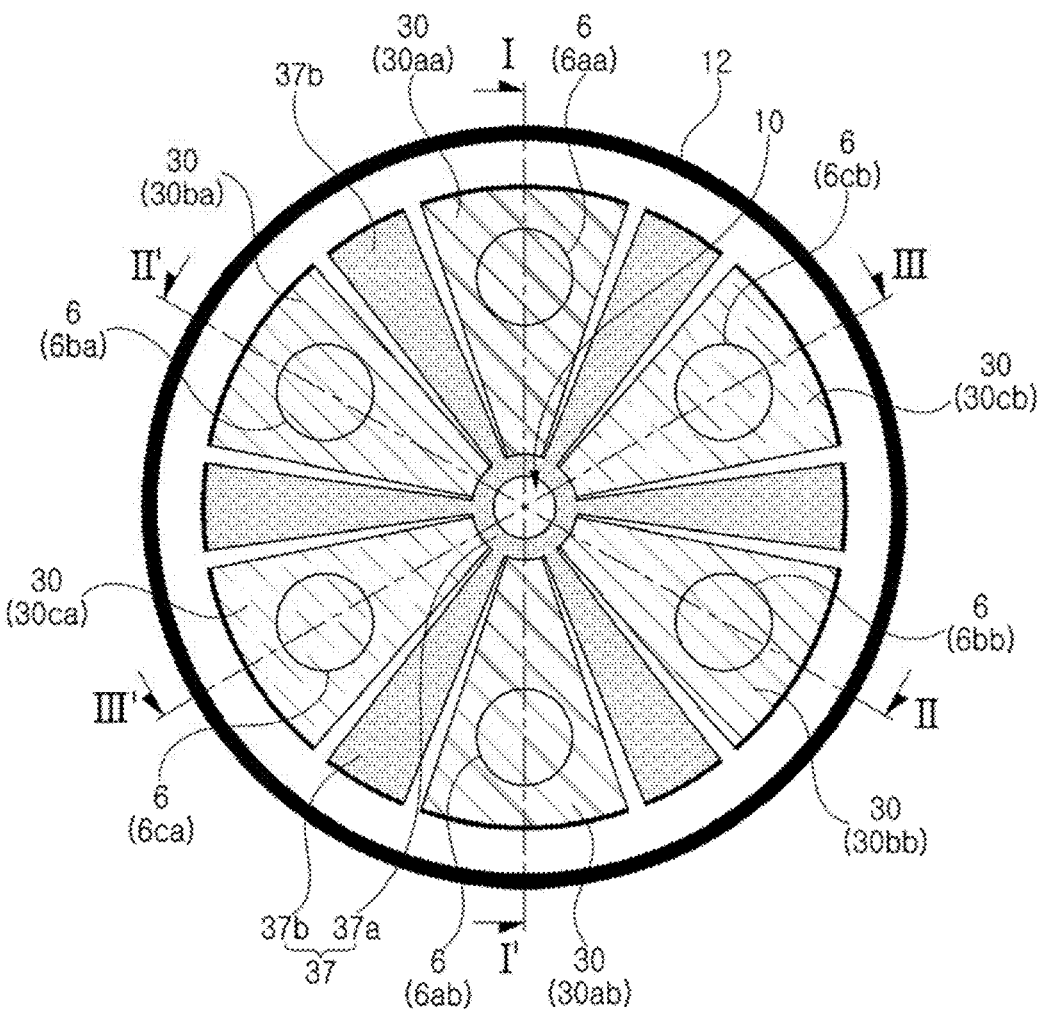
FIGS. 4, 5, 6, and 7 are views respectively illustrating an example of the substrate processing apparatus according to some example embodiments of the present inventive concepts.
Figure 5:
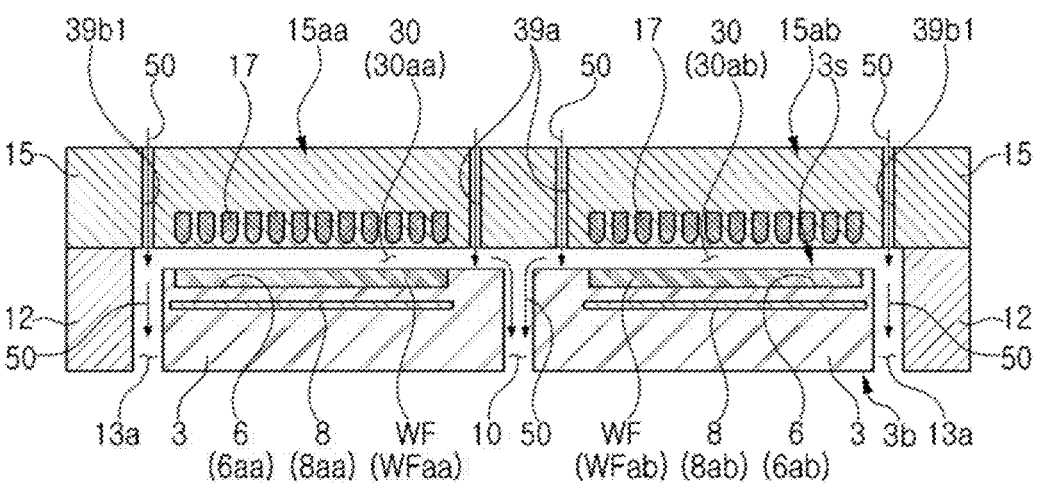
Figure 6:
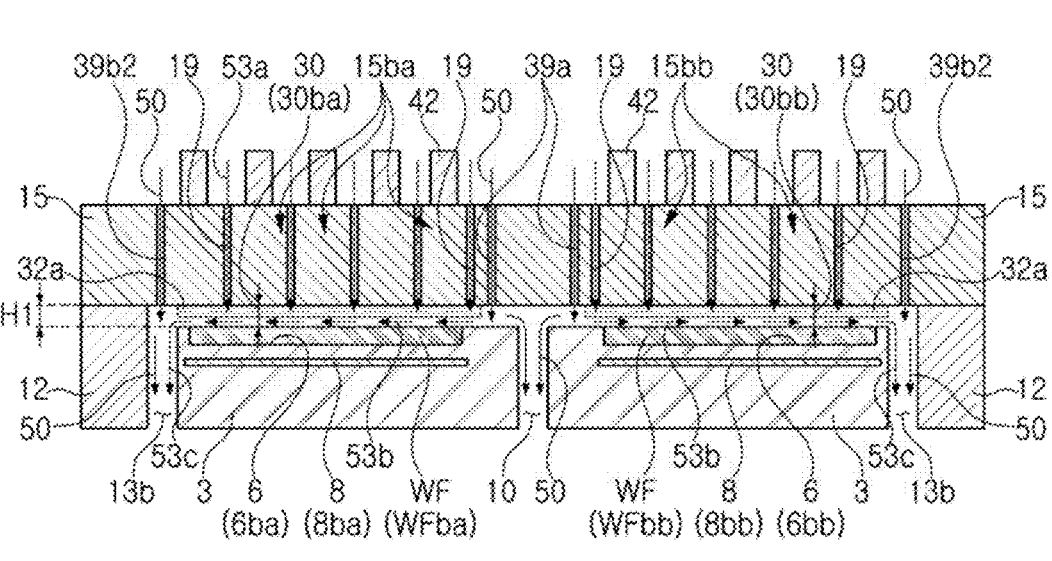
Figure 7:
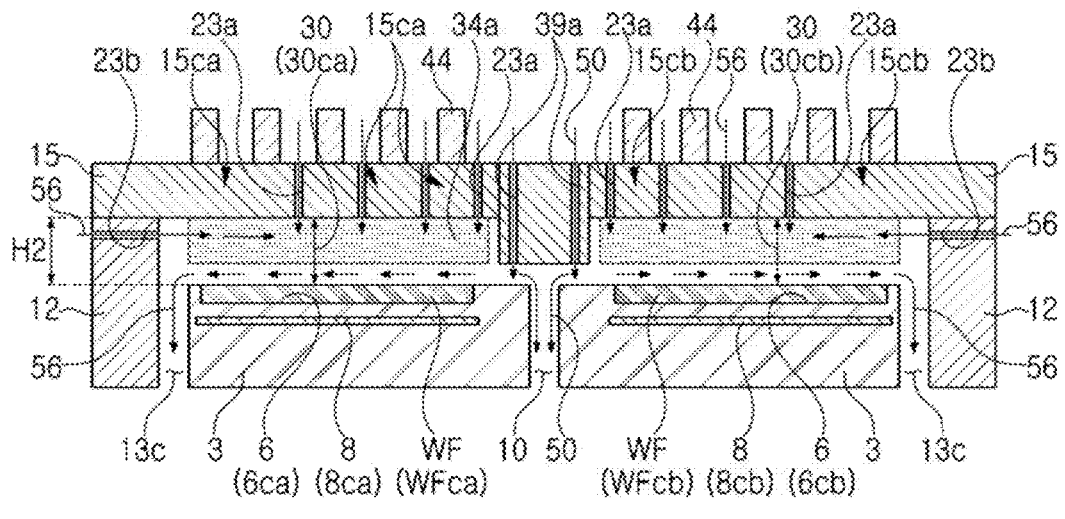

FIGS. 4, 5, 6, and 7 are views respectively illustrating an example of the substrate processing apparatus according to some example embodiments of the present inventive concepts: FIG. 4 is a top view conceptually illustrating a portion of the substrate processing apparatus according to some example embodiments of the present inventive concepts; FIG. 5 is a cross-sectional view conceptually illustrating a region taken along line I-I' of FIG. 4; FIG. 6 is a cross-sectional view conceptually illustrating a region taken along line II-IP of FIG. 4; and FIG. 7 is a cross-sectional view conceptually illustrating a region taken along line III-IIP of FIG. 4.

Referring to FIGS. 4 to 7, a substrate processing apparatus 1 according to some example embodiments may include a substrate support 3 including substrate-seating portions 6 on each of which a plurality of substrates WF are disposed, a chamber sidewall 12 surrounding at least a side surface of the substrate support 3, an upper plate 15 including a plurality of plate portions disposed on and spaced apart from the substrate support 3, a plurality of process regions 30 disposed between the plurality of plate portions and the substrate support 3, and a separation region 37 disposed between the plurality of process regions 30. The substrate support 3 may be understood to support (e.g., structurally support, support the weight of, etc.) the plurality of substrates WF such that the substrates WF are on (e.g., the plurality of substrates WF is on, the substates WF transfer their respective weights to, etc.) the substrate support 3.

The chamber sidewall 12 may be spaced apart from the side surface of the substrate support 3. External gas outlets 13a, 13b and 13c may be arranged between the chamber sidewall 12 and the side surface of the substrate support 3. The chamber sidewall 12 may be substantially flat.

The plurality of plate portions may include a first pretreatment process plate portion 15*ba* and a first deposition process plate portion 15*ca*.

The plurality of process regions 30 may include a first pretreatment process region 30*ba* disposed between the first pretreatment process plate portion 15*ba* and the substrate support 3 and having a first height H1 (e.g., where the first height H1 is the magnitude of the vertical distance between opposing surfaces of the substrate support 3 and the first pretreatment process plate portion 15*ba*), and a first deposition process region 30*ca* disposed between the first deposition process plate portion 15*ca* and the substrate support 3 and having a second height H2 (e.g., where the second height H2 is the magnitude of the vertical distance between opposing surfaces of the substrate support 3 and the first deposition process plate portion 15*ca*) greater than the first height H1.

The second height H2 may be equal to or greater than about twice the first height H1, and equal to or less than about twenty times the first height H1.

The first height H1 may be in a range of about 10 mm to about 50 mm, and the second height H2 may be in a range of about 100 mm to about 200 mm.

The first pretreatment process plate portion 15*ba* may include a pretreatment process gas nozzle 19 injecting (e.g., configured to inject) a pretreatment process gas 53*a* for pre-treating (e.g., to pre-treat) a substrate WFba (e.g., a first substrate of the plurality of substrates WF) disposed on the substrate support 3 in the first pretreatment process region 30*ba*.

The substrate processing apparatus 1 according to some example embodiments may further include a plasma generation device 42 forming a plasma region 32*a* in the first pretreatment process region 30*ba*. The plasma generation device 42 may be a microwave source.

The upper plate 15 may further include an outer gas nozzle 39*b*2 injecting a purge gas 50 for protecting the chamber sidewall 12 facing the first pretreatment process region 30*ba*. Accordingly, the purge gas 50 injected from the outer gas nozzle 39*b*2 may serve to prevent the chamber sidewall 12 facing the first pretreatment process region 30*ba* from being damaged by plasma in the plasma region 32*a* in the first pretreatment process region 30*ba*.

The first height H1 may be set in the range of about 10 mm to about 50 mm, and it is thus possible to more efficiently and reliably perform the pretreatment process performed in the first pretreatment process region 30*ba*. For example, the pretreatment process gas 53*a* may be a hydrogen gas, and may form the plasma region 32*a* in the first pretreatment process region 30*ba*. In addition, the pretreatment process gas 53*a* may form hydrogen radicals 53*b*, an oxide layer may be removed while a H$_2$O gas 53*c* is generated by coupling the hydrogen radicals 53*b* with oxygen in the oxide layer disposed on a surface of the substrate WFba, and the H$_2$O gas 53*c* may be discharged. The hydrogen radicals 53*b* may have a short lifetime. Accordingly, it is possible to set the first height H1 in the range of about 10 mm to about 50 mm to supply more hydrogen radicals 53*b* to the surface of the substrate WFba, thereby more effectively pre-treating the surface of the substrate WFba or WFbb.

The first deposition process plate portion 15*ca* may include a first deposition process gas nozzle 23*a* injecting (e.g., configured to inject) a deposition process gas 56 for depositing (e.g., to deposit) the material layer on a substrate WFca (e.g., a second substrate of the plurality of substrates WF) disposed on the substrate support 3 in the first deposition process region 30*ca*. The deposition process gas 56 may be a process gas for forming material such as graphene, and may be a process gas including a C$_2$H$_2$ gas or a C$_2$H$_6$ gas for example.

The substrate processing apparatus 1 according to some example embodiments may further include a plasma generation device 44 forming a plasma region 34*a* in the first deposition process region 30*ca*. The plasma generation device 44 may be the microwave source.

The second height H2 of the first deposition process region 30*ca* may be set in the range of about 100 mm to about 200 mm, and it is thus possible to form the material layer such as the graphene layer on the substrate WFca while minimizing damage to the surface of the substrate WFca occurring when performing the deposition process in the first deposition process region 30*ca*, for example, the damage by plasma. Accordingly, the high-quality graphene layer may be formed on the substrate WFca. For example, the quality of the graphene layer may be determined by carrier mobility, high permeability, rigid strength, or high elasticity.

As shown in at least FIG. 4, the plurality of plate portions may further include a first annealing process plate portion 15*aa*, and the plurality of process regions 30 may further include a first annealing process region 30*aa* disposed between (e.g., at least partially defined between opposing surfaces of) the first annealing process plate portion 15*aa* and the substrate support 3.

The first annealing process region 30*aa* may have a height (e.g., a magnitude of the vertical distance between the opposing surfaces of the first annealing process plate portion 15*aa* and the substrate support 3) substantially equal to the first height H1. The first annealing process region 30*aa* may have the height less than (e.g., smaller than) the second height H2. The first annealing process region 30*aa* may have the height less than the second height H2, and thus have increased heat treatment efficiency.

The upper plate 15 may further include an outer gas nozzle 39*b*1 injecting the purge gas 50 for protecting the chamber sidewall 12 facing (e.g., at least partially defining) the first annealing process region 30*aa*.

The plurality of plate portions may further include a second pretreatment process plate portion 15*bb* and a second deposition process plate portion 15*cb*.

The plurality of plate portions may further include a second annealing process plate portion 15*ab*.

The plurality of process regions 30 may further include a second pretreatment process region 30*bb*, a second deposition process region 30*cb* and a second annealing process region 30*ab*.

The second pretreatment process region 30*bb* may be disposed between (e.g., at least partially defined between opposing surfaces of) the second pretreatment process plate portion 15*bb* and the substrate support 3, and may have the same size as the first pretreatment process region 30*ba*.

The second deposition process region 30*cb* may be disposed between (e.g., at least partially defined between opposing surfaces of) the second deposition process plate portion 15*cb* and the substrate support 3, and may have the same size as the first deposition process region 30*ca*.

The second annealing process region 30*ab* may be disposed between (e.g., at least partially defined between opposing surfaces of) the second annealing process plate portion 15*ab* and the substrate support 3, and may have the same size as the first annealing process region 30*aa*.

Based on a center of the substrate support from the top view of FIG. 4, the first annealing process region 30aa, the first pretreatment process region 30ba, the first deposition process region 30ca, the second annealing process region 30ab, the second pretreatment process region 30bb and the second deposition process region 30cb may be sequentially arranged in a clockwise direction. The first annealing process region 30aa and the second annealing process region 30ab may have mirror-symmetric structures, the first pretreatment process region 30ba and the second pretreatment process region 30bb may have mirror-symmetric structures, and the first deposition process region 30ca and the second deposition process region 30cb may have mirror-symmetric structures. The mirror-symmetric structures of first annealing process region 30aa and the second annealing process region 30ab, the mirror-symmetric structures of the first pretreatment process region 30ba and the second pretreatment process region 30bb, and the mirror-symmetric structures of the first deposition process region 30ca and the second deposition process region 30cb may be similarly shaped structures or differently shaped structures in relation to each other.

The second deposition process plate portion 15cb may have the same structure (e.g., a same size and shape) as the first deposition process plate portion 15ca. The second pretreatment process plate portion 15bb may have the same structure (e.g., a same size and shape) as the first pretreatment process plate portion 15ba. For example, like the first pretreatment process plate portion 15ba, the second pretreatment process plate portion 15bb may include the pretreatment process gas nozzle 19 injecting the pretreatment process gas 53a for pre-treating the substrate WFbb disposed on the substrate support 3 in the second pretreatment process region 30bb, and like the first deposition process plate portion 15ca, the second deposition process plate portion 15cb may include the first deposition process gas nozzle 23a injecting the deposition process gas 56 for depositing the material layer on the substrate WFcb disposed on the substrate support 3 in the second deposition process region 30cb. The second annealing process plate portion 15ab may have the same structure (e.g., a same size and shape) as the first annealing process plate portion 15aa.

The substrate processing apparatus 1 may further include a heating member 17. The heating member 17 may be a lamp that heats the substrate WFaa or WFab disposed on substrate-seating portions 6aa or 6ab of the substrate support 3 in the first or second annealing process region 30aa or 30ab (e.g., a third substrate of the plurality of substrate WF). In another example, the heating member 17 may be not only the lamp, but also another heating member. For example, the heating member 17 may be a heating member for performing plasma annealing that heats the substrate using plasma generated in the first or second annealing process region 30aa or 30ab.

From the top view of FIG. 4, the plurality of process regions 30 may be spaced apart from each other, and the separation region 37 may be disposed between the plurality of process regions 30. For example, and as shown in at least FIG. 4, the plurality of process regions 30 may have horizontal boundaries (e.g., azimuthal and/or radial boundaries) that are at least partially defined by the horizontal boundaries (e.g., azimuthal and/or radial boundaries) of vertical overlap between opposing surfaces of the substrate support 3 and separate, respective plate portions of the upper plate 15, such that the horizontal (e.g., azimuthal and/or radial) boundaries of separate process regions 30 may be spaced apart from each other and at least part of the separation region 37 may be defined with a space at least partially between at least two separate process regions 30 (e.g., between some or all of the plurality of process regions 30). The separation region 37 may include a first region 37a disposed in a central portion of the substrate processing apparatus and second regions 37b extended between the plurality of process regions 30 adjacent to each other from the first region 37a toward the chamber sidewall 12. Each of the second regions 37b may have a width increased from the first region 37a toward the chamber sidewall 12.

The upper plate 15 may include separation gas nozzles 39a each injecting (e.g., configured to inject) the separation gas 50 toward the separation region 37. The separation gas 50 may be the purge gas. The purge gas may be an inert gas such as argon (Ar), helium (He), krypton (Kr) or nitrogen (N2).

The upper plate 15 may be coated with an aluminum(III) oxide ($Al_2O_3$) material, a Yttrium(II) oxide ($Y_2O_3$) material or the like.

The substrate support 3 may have a circular shape. The substrate support 3 may further include a central gas outlet 10 disposed in its central region. At least a portion of the separation gas injected from the separation gas nozzles 39a of the upper plate 15, that is, the purge gas 50 may be discharged through the central gas outlet 10.

The substrate support 3 may include heaters 8 (e.g., two or more heaters 8) disposed under the substrates WF disposed on the substrate-seating portions 6. The heaters 8 may include first heaters 8aa and 8ab respectively overlapping the first and second annealing process regions 30aa and 30ab, second heaters 8ba and 8bb respectively overlapping the first and second pretreatment process regions 30ba and 30bb, and third heaters 8ca and 8cb respectively overlapping the first and second deposition process regions 30ca and 30cb.

The substrate-seating portions 6 may include the first substrate-seating portions 6aa and 6ab on which the wafers WFaa and WFab respectively overlapping the first heaters 8aa and 8ab are disposed, second substrate-seating portions 6ba and 6bb on which the wafers WFba and WFbb respectively overlapping the second heaters 8ba and 8bb are disposed, and third substrate-seating portions 6ca and 6cb on which the wafers WFca and WFcb respectively overlapping the third heaters 8ca and 8cb are disposed.

The substrate-seating portions 6 may include a quartz material, a silicon carbide (SiC) material, or a combination thereof.

The heaters 8 may heat the substrates WF in a temperature range of about 100° C. to about 700° C.

The heaters 8 may include aluminum nitride (AlN), aluminum (Al), silicon carbide (SiC) or stainless steel.

The first heaters 8aa and 8ab, the second heaters 8ba and 8bb, and the third heaters 8ca and 8cb may be rotated, and may be moved at a rotation speed of about 0 to about 50 rpm.

The first heaters 8aa and 8ab, the second heaters 8ba and 8bb, and the third heaters 8ca and 8cb may be vertically moved. Accordingly, the first heaters 8aa and 8ab, the second heaters 8ba and 8bb, and the third heaters 8ca and 8cb may be disposed at the same height or at the same height or may be disposed at different heights, respectively, based on a process temperature.

The chamber sidewall 12 may include a second deposition process gas nozzle 23b injecting the deposition process gas 56 toward respective upper regions of the first and second deposition process regions 30ca and 30cb. The second deposition process gas nozzle 23b may be disposed higher than a middle of each of the first and second deposition process regions 30*ca* and 30*cb*, between upper and lower ends thereof, and closer to the upper end of each of the first and second deposition process regions 30*ca* and 30*cb* than the middle of each of the first and second deposition process regions 30*ca* and 30*cb*.

As described herein, the terms "higher", "middle", "upper end," "lower end," and the like may at least partially refer to and/or be associated with one or more distances in a vertical direction from a reference location. The vertical direction (e.g., the directions of heights H1, H2, etc.) may refer to a direction that extends perpendicular to one or more surfaces, for example a surface of the substrate support 3 that opposes a surface of one or more plate portions of the upper plate 15 (e.g., uppermost surface 3*s*). The reference location may be, for example, an uppermost surface of the substrate support 3 (e.g., uppermost surface 3*s*), a lower surface of the substrate support 3 (e.g., lowermost surface 3*b*), a lowest point in the above-noted vertical direction that is distal to the plurality of substrate WF in relation to the substrate support 3, etc. It may be understood that an element that is "higher" than another element herein may be further from the reference location (e.g., a portion of the substrate support 3) in the vertical direction than the other element. An element that is described to be "between" upper and lower ends of another element may be understood to be closer to the reference location in the vertical direction than the aforementioned "upper" end of the other element and further from the reference location in the vertical direction than the aforementioned "lower" end of the other element. References to an element being "above" or "under" another element may refer to the element being further than or closer to the reference location, respectively, in the vertical direction in relation to the other element.

The description describes a flow of the deposition process gas 56, based on the position of the second deposition process gas nozzle 23*b* with reference to FIGS. 8A to 8C and 9.

Figure 8A:
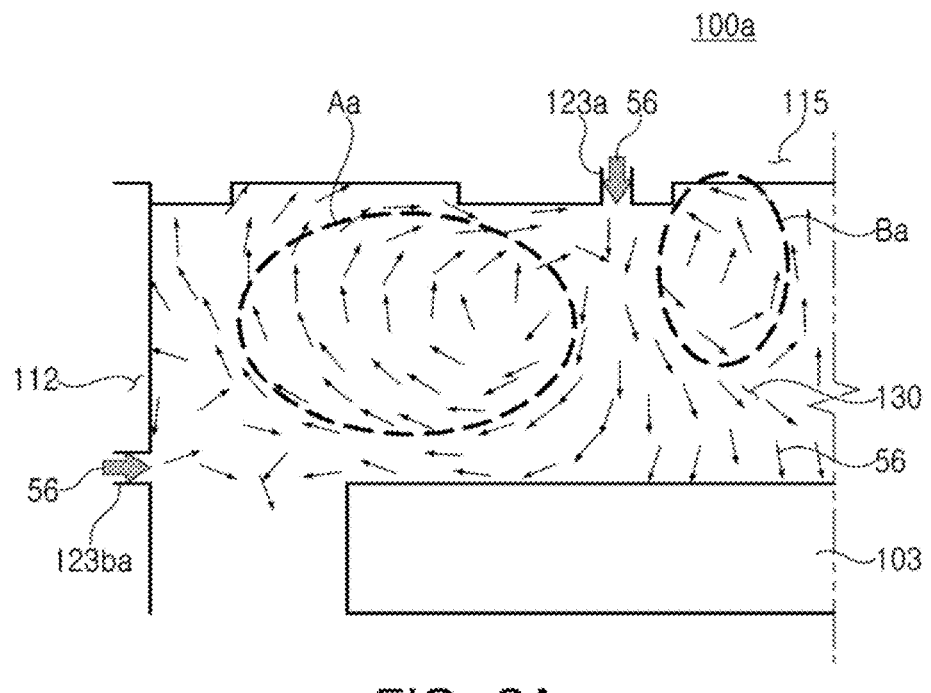
FIGS. 8A, 8B, and 8C are views for comparison with the substrate processing apparatus according to some example embodiments of the present inventive concepts.
Figure 8B:
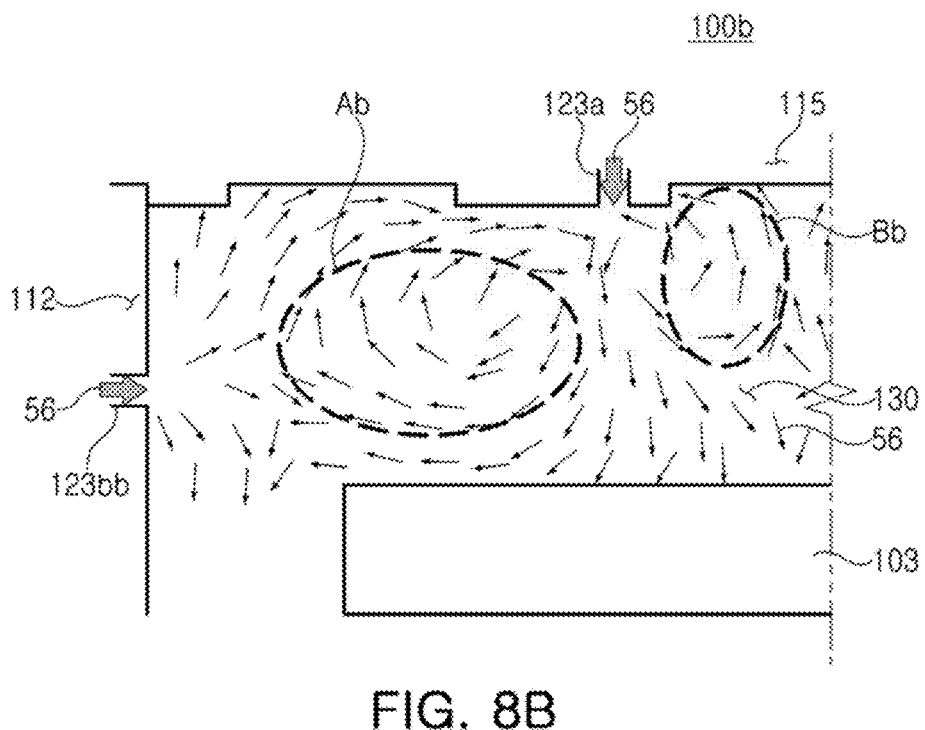
Figure 8C:
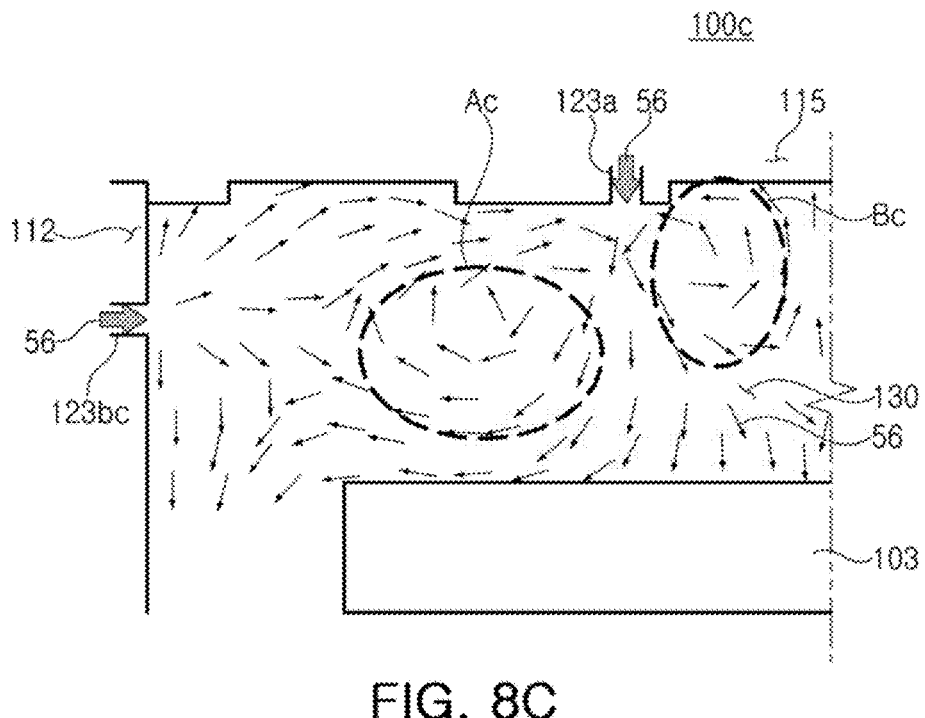
Figure 9:
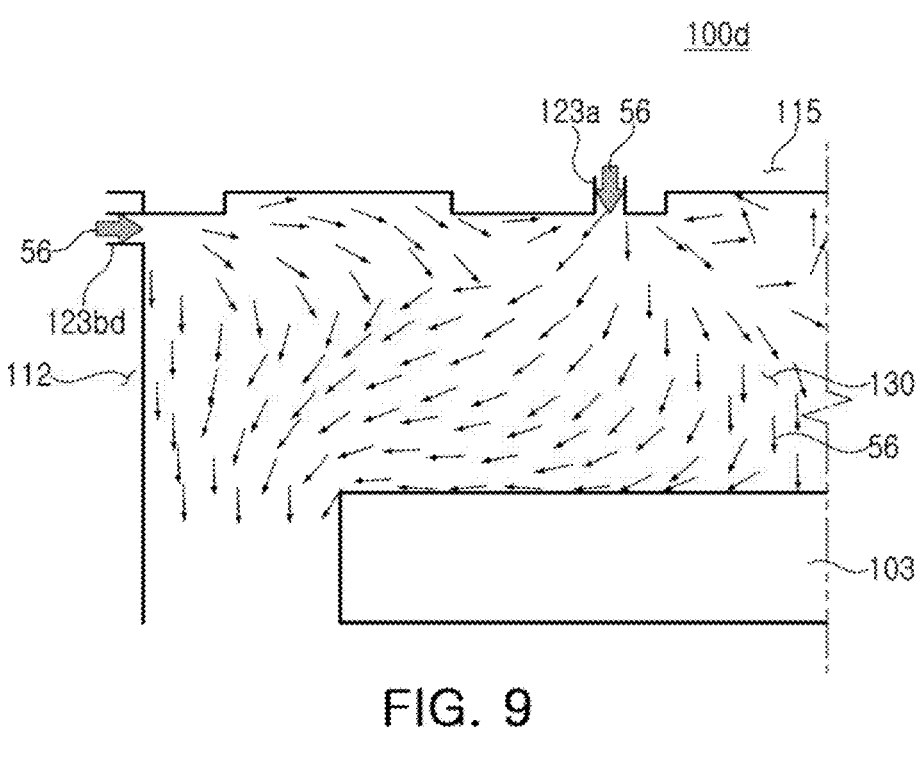
FIG. 9 is a view illustrating the substrate processing apparatus according to some example embodiments of the present inventive concepts.

FIGS. 8A, 8B, and 8C and FIG. 9 are views each schematically illustrating a computer simulation result illustrating the flow of the deposition process gas 56 based on the position of the second deposition process gas nozzle 23*b*: FIG. 8A illustrates a first substrate processing apparatus 100*a* for comparison with the substrate processing apparatus according to some example embodiments of the present inventive concepts; FIG. 8B illustrates a second substrate processing apparatus 100*b* for the comparison with the substrate processing apparatus according to some example embodiments of the present inventive concepts; FIG. 8C illustrates a third substrate processing apparatus 100*c* for the comparison with the substrate processing apparatus according to some example embodiments of the present inventive concepts; and FIG. 9 illustrates a fourth substrate processing apparatus 100*d* illustrating the substrate processing apparatus according to some example embodiments of the present inventive concepts.

Referring to FIGS. 8A, 8B, and 8C and FIG. 9, the first to fourth substrate processing apparatuses 100*a*, 100*b*, 100*c* and 100*d* of FIGS. 8A to 8C and 9 may commonly include: a substrate support 103, an upper plate 115 disposed on and spaced apart from the substrate support 103, a deposition process region 130 disposed between the substrate support 103 and the upper plate 115, an upper injection nozzle 123*a* injecting the deposition process gas 56 into a deposition process region 130, and a chamber sidewall 112 surrounding a side surface of the substrate support 103 and facing one side of the deposition process region 130.

The first substrate processing apparatus 100*a* (in FIG. 8A) may include a first injection nozzle 123*ba* disposed on the chamber sidewall 112 facing a lower region of the deposition process region 130, and injecting the deposition process gas 56.

The second substrate processing apparatus 100*b* (in FIG. 8B) may include a second injection nozzle 123*bb* disposed lower than a middle of the deposition process region 130, between upper and lower ends thereof, and closer to the middle of the deposition process region 130 than the lower end of the deposition process region 130, and injecting the deposition process gas 56.

The third substrate processing apparatus 100*c* (in FIG. 8C) may include a third injection nozzle 123*bc* disposed higher than the middle of the deposition process region 130, and closer to the middle of the deposition process region 130 than the upper end of the deposition process region 130, and injecting the deposition process gas 56.

The fourth substrate processing apparatus 100*d* (in FIG. 9) may include a fourth injection nozzle 123*bd* disposed higher than the middle of the deposition process region 130, and closer to the upper end of the deposition process region 130 than the middle of the deposition process region 130, and injecting the deposition process gas 56.

The deposition process gas 56 may allow a vortex to occur in regions indicated by 'Aa' and 'Ba' in FIG. 8A in the deposition process region 130 of the first substrate processing apparatus 100*a* (in FIG. 8A), the deposition process gas 56 may allow the vortex to occur in regions indicated by 'Ab' and 'Bb' in FIG. 8B in the deposition process region 130 of the second substrate processing apparatus 100*b* (in FIG. 8B), and the deposition process gas 56 may allow the vortex to occur in regions indicated by 'Ac' and 'Bc' in FIG. 8C in the deposition process region 130 of the third substrate processing apparatus 100*c* (in FIG. 8C). Meanwhile, the deposition process gas 56 may allow a vortex significantly smaller than that occurring in the first to third substrate processing apparatuses 100*a*, 100*b*, and 100*c* or little vortex to occur in the deposition process region 130 of the fourth substrate processing apparatus 100*d* (in FIG. 9).

The fourth injection nozzle 123*bd* may be disposed as in the fourth substrate processing apparatus 100*d* (in FIG. 9), thereby allowing the deposition process gas 56 to flow to a surface of the substrate support 103 uniformly and stably in the deposition process region 130.

Next, referring to FIGS. 10 and FIGS. 11, 12, 13, 14, 15, and 16, the description describes a method of manufacturing a semiconductor device using the above-described substrate processing apparatuses and substrate processing method. In FIGS. 10 and 11 to 16, FIG. 10 is a flow chart illustrating the method of manufacturing a semiconductor device using the above-described substrate processing apparatuses and substrate processing method; and FIGS. 11, 12, 13, 14, 15, and 16 are cross-sectional views illustrating the method of manufacturing a semiconductor device using the above-described substrate processing apparatuses and substrate processing method.

Figure 10:
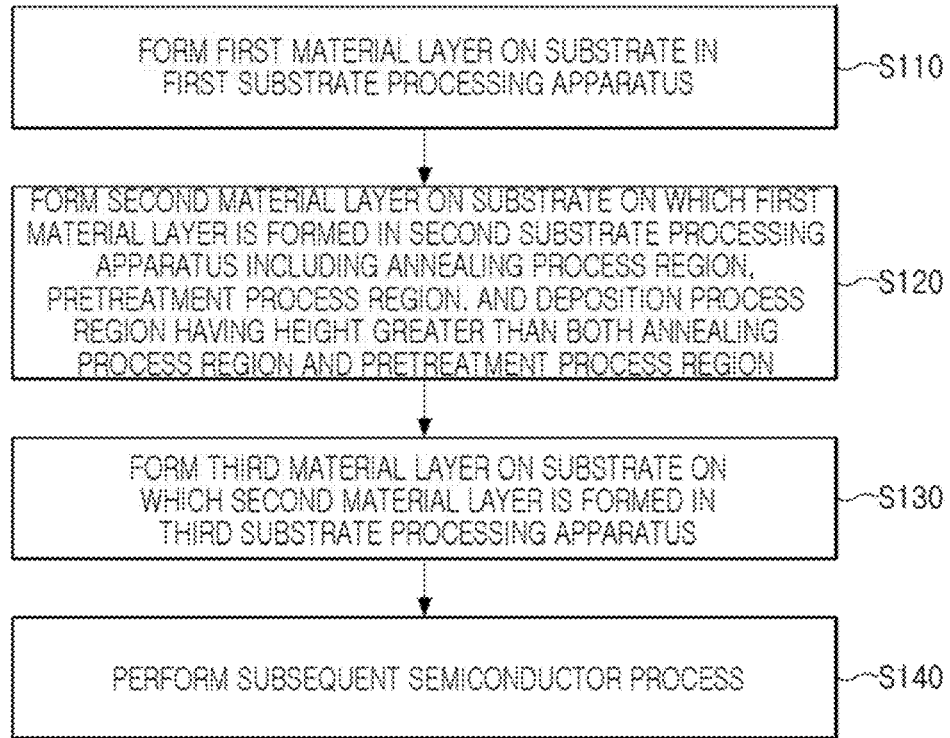
FIG. 10 is a flowchart illustrating a method of manufacturing a semiconductor device according to some example embodiments of the present inventive concepts.
Figure 11:
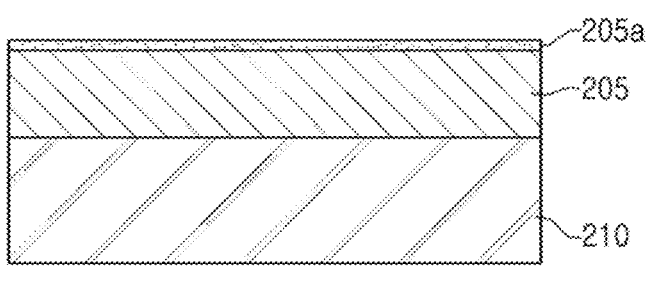
FIGS. 11, 12, 13, 14, 15, and 16 are cross-sectional views illustrating the method of manufacturing a semiconductor device according to some example embodiments of the present inventive concepts.
Figure 12:
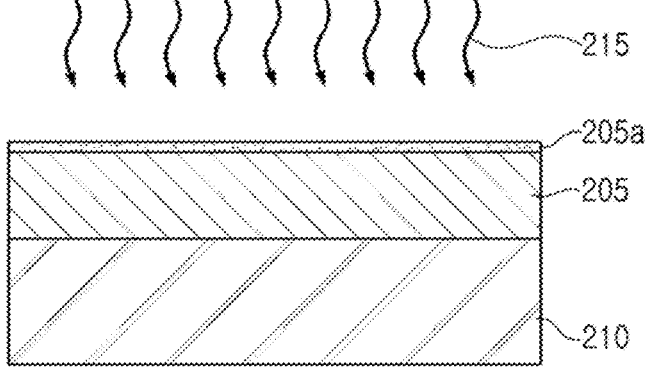

Referring to FIGS. 10 and 11, a first material layer 205 may be formed on a substrate in a first substrate processing apparatus (S110). The substrate may be a semiconductor wafer.

An oxide layer 205*a* may be formed on the first material layer 205. The oxide layer 205*a* may be a native oxide layer formed on a surface of the first material layer 205. For example, when the first material layer 205 is a silicon layer or a metal layer, the oxide layer 205*a* may be a silicon oxide layer or a metal oxide layer.

A substrate 210 on which the first material layer 205 is formed may be unloaded from the first substrate processing apparatus.

The oxide layer 205a may also be formed after the substrate 210 on which the first material layer 205 is formed is unloaded from the first substrate processing apparatus.

Referring to FIGS. 10 and 12 to 15, a second material layer 240 in contact with the first material layer 205 may be formed on the substrate 210 on which the first material layer 205 is formed in the substrate processing apparatus 1 (in FIGS. 4 to 7) including the first and second annealing process regions 30aa and 30ab (in FIGS. 4 to 7), the first and second pretreatment process regions 30ba and 30bb in FIGS. 4 to 7), and the first and second deposition process regions 30ca and 30cb (in FIGS. 4 to 7) each having a height greater than both the first and second annealing process regions 30aa and 30ab (in FIGS. 4 to 7) and the first and second pretreatment process regions 30ba and 30bb (in FIGS. 4 to 7) (S120).

The second material layer 240 (in FIG. 15) may be formed as follows: an annealing process 215 (in FIG. 12) may be performed on the substrate 210 on which the first material layer 205 and the oxide layer 205a are formed in the annealing process region, a pretreatment process 220 (in FIG. 13) may be performed on the substrate 210 on which the annealing process 215 (in FIG. 12) is already performed to remove the oxide layer 205a (in FIG. 12), thus exposing the first material layer 205, and a deposition process 230 (in FIG. 14) may be performed on the substrate 210 from which the first material layer 205 is exposed in the deposition process region to form a second material layer 240a (in FIG. 14).

The oxide layer 205a (in FIG. 12) may be removed by performing the pretreatment process 220 (in FIG. 13), which may be the same as the pretreatment process described with reference to FIGS. 4 to 7. For example, as described with reference to FIGS. 4 to 7, the plasma region 32a may be formed in the first pretreatment process region 30ba. In addition, hydrogen radicals 53b may be formed, an oxide layer may be removed while a $H_2O$ gas 53c is generated by coupling the hydrogen radicals 53b with oxygen in the oxide layer disposed on the surface of the substrate WFba, and the $H_2O$ gas 53c may be discharged. Here, the oxide layer may be the oxide layer 205a in FIG. 12.

Figures 13, 14:
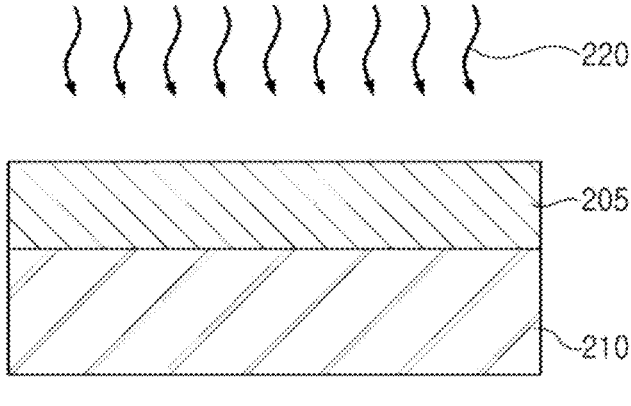

When the second material layer 240a (in FIG. 14) is not formed to have the desired thickness, the second material layer 240 (in FIG. 15) having the desired thickness may be formed by repeating the annealing process 215 (in FIG. 12), the pretreatment process 220 (in FIG. 13) and the deposition process 230 in (FIG. 14). Accordingly, the second material layer 240 (in FIG. 15) may include a plurality of layers 240a, 240b and 240c formed by repeating the deposition process 230 (in FIG. 14). The substrate 210 on which the second material layer 240 is formed may be unloaded from the second substrate processing apparatus.

The second material layer 240 (in FIG. 15) may be a graphene-like carbon material layer. For example, the second material layer 240 (in FIG. 15) may be a graphene layer. A material of second material layer 240 (in FIG. 15) may be single layer graphene, multi-layer graphene, graphitic carbon, or graphite. For example, the second material layer 240 (in FIG. 15) may be formed of the graphene material. The second material layer 240 (in FIG. 15) may be formed of the high-quality graphene material.

Figure 15:
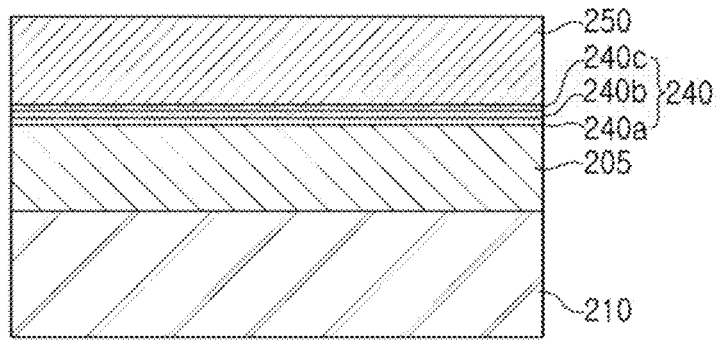
Figure 16:
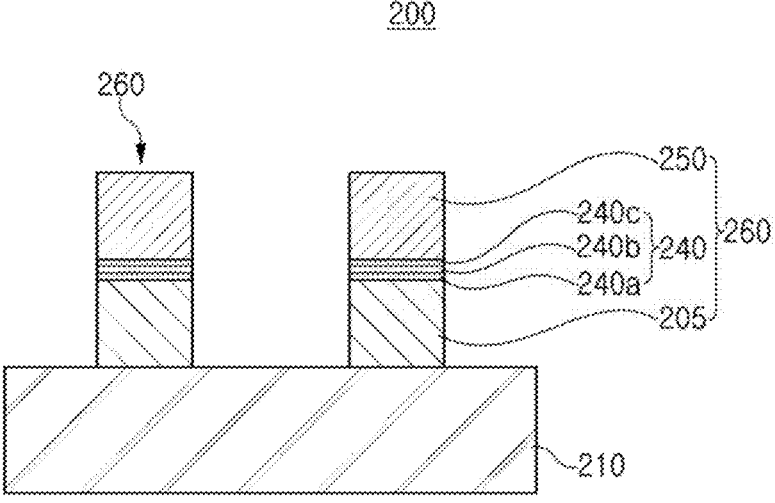

Referring to FIGS. 10, 15, and 16, the substrate 210 on which the second material layer 240 is formed may be loaded into a third substrate processing apparatus. A third material layer 250 (in FIG. 15) may be formed on the substrate 210 on which the second material layer 240 (in FIG. 15) is formed in the third substrate processing apparatus (S130). The substrate 210 on which the third material layer 250 is formed may be unloaded from the third substrate processing apparatus.

Next, subsequent semiconductor processes may be performed (S140). The subsequent semiconductor processes may be a photo process and an etching process. For example, the first material layer 205, the second material layer 240 and the third material layer 250, sequentially formed on the substrate 210, may be patterned to form pattern structures 260 on the substrate 210. Accordingly, a semiconductor device 200 including the pattern structures 260 may be formed.

The semiconductor device 200 may be manufactured using the substrate processing method described with reference to FIGS. 1 to 3 and the substrate processing apparatus 1 described with reference to FIGS. 4 to 7. Accordingly, the semiconductor device 200 may include the second material layer 240 including the high-quality graphene layer.

As set forth above, some example embodiments of the present inventive concepts may provide the substrate processing apparatus capable of forming the high-quality graphene layer, the substrate processing apparatus, and the method of manufacturing a semiconductor device using the same. In order to form the high-quality graphene layer, the substrate processing apparatus may include the pretreatment process region having the first height and the deposition process region having the second height, greater than the first height. As such, the pretreatment process region may have the lower height, and the substrate may thus be pre-treated while having the minimized damage to its surface.

The substrate processing apparatus may accommodate the plurality of substrates. Accordingly, the plurality of substrates may be loaded into the substrate processing apparatus, respectively, the graphene layer may be formed on each of the plurality of substrates loaded into the substrate processing apparatus, and the plurality of substrates on each of which the graphene layer is formed may then be unloaded from the substrate processing apparatus.

It will be understood that the substrate processing apparatus according to any of the example embodiments may be communicatively coupled to a control device, referred to herein as a substrate processing apparatus control device, which may be an electronic device which may be configured to control the substrate processing apparatus to perform one or more operations (also referred to herein as steps and/or processes), and/or any operations, of another of the methods of manufacturing a semiconductor chip according to any of the example embodiments, including some or all operations of any of the methods shown in FIGS. 1, 2, 3, 10, 11-16, or any combination thereof.

Figure 17:
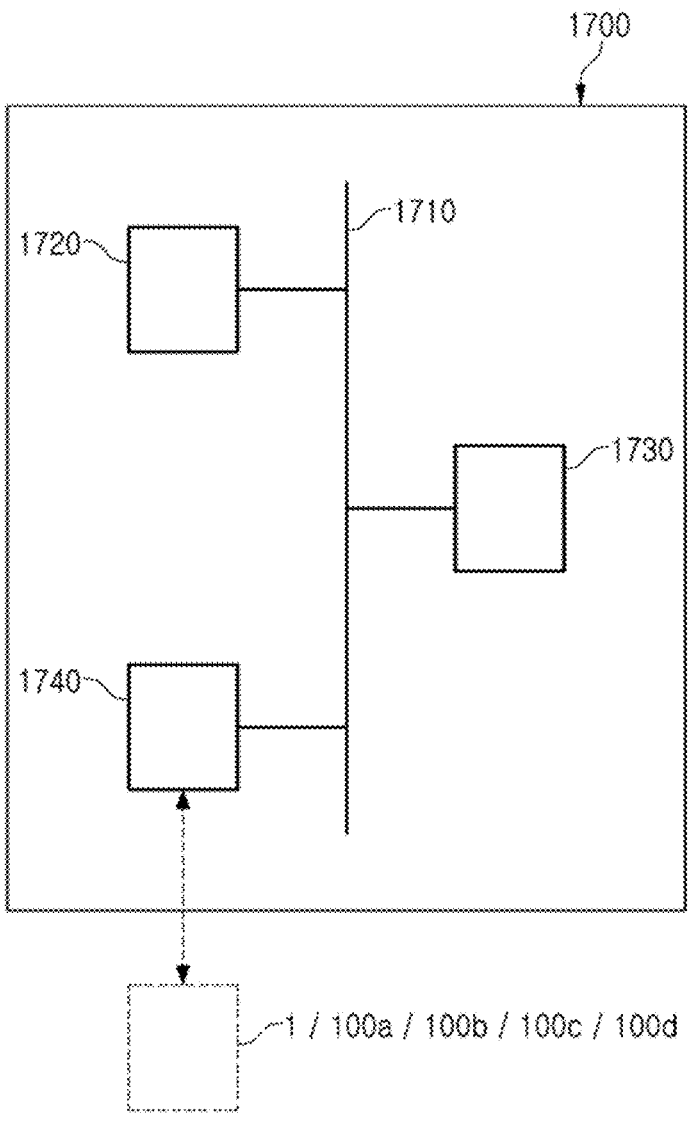
FIG. 17 is a block diagram of a substrate processing apparatus control device according to some example embodiments.

FIG. 17 is a block diagram of a substrate processing apparatus control device 1700 according to some example embodiments.

Referring to FIG. 17, a substrate processing apparatus control device 1700 may include a processor 1720, a memory 1730, and an interface 1740 that are electrically coupled together via a bus 1710. The interface 1740 may be a communication interface (e.g., a wired or wireless communication transceiver).

The interface 1740 may be communicatively coupled with one or more portions of the substrate processing apparatus according to any of the example embodiments (e.g., any of the substrate processing apparatuses 1, 100a, 100b, 100c, and/or 100*d*). The memory 1730 may be a non-transitory computer readable storage medium (e.g., a solid state drive SSD) storing a program of instructions. The processor 1720 (e.g., a central processing unit CPU) may be configured to execute the program of instructions stored at the memory 1730 to cause one or more, or all, of the operations of any of the methods according to any of the example embodiments to be performed (e.g., based on generating a command signal and causing the command signal to be transmitted to one or more portions of the communicatively coupled substrate processing apparatus via the interface 1740.

For example, the substrate processing apparatus may further include one or more gas flow control valves coupled to separate, respective nozzles of the substrate processing apparatus. For example, the substrate processing apparatus according to any of the example embodiments may include a pretreatment process gas flow control valve coupled to the pretreatment process gas nozzle and configured to be selectively and/or adjustably actuated to selectively and/or adjustably control the flow of the pretreatment process gas through the pretreatment process gas nozzle into the first pretreatment process region. In another example, the substrate processing apparatus according to any of the example embodiments may include a first deposition process gas flow control valve coupled to the first deposition process gas nozzle and configured to be selectively and/or adjustably actuated to selectively and/or adjustably control the flow of the deposition process gas through the first deposition process gas nozzle into the first deposition process region. In another example, the substrate processing apparatus according to any of the example embodiments may include a separation gas flow control valve coupled to the separation gas nozzle and configured to be selectively and/or adjustably actuated to selectively and/or adjustably control the flow of the separation gas (e.g., purge gas) through the separation gas nozzle into the separation region. In another example, the substrate processing apparatus according to any of the example embodiments may include a second deposition process gas flow control valve coupled to the second deposition process gas nozzle and configured to be selectively and/or adjustably actuated to selectively and/or adjustably control the flow of the deposition process gas through the second deposition process gas nozzle into the upper region of the first deposition process region.

In some example embodiments, the substrate processing apparatus may include an actuator, for example a servo actuator, servo arm, robotic arm, or the like which may be configured to move one or more substrates into and/or out of the substrate support apparatus, for example to load one or more substrates on the substrate support in the substrate processing apparatus, to cause one or more substrates to be moved between different regions in the substrate processing apparatus, to unload one or more substrates from the substrate processing apparatus, any combination thereof, or the like.

In some example embodiments, the substrate processing apparatus may include one or more additional devices configured to perform a subsequent semiconductor process (e.g., a photo process and/or an etching process), including for example an etching laser.

In some example embodiments, a substrate processing apparatus control device 1700 according to any of the example embodiments may be communicatively coupled to any of the actuators, gas flow control valves, heaters, plasma generation devices, one or more additional devices, any combination thereof, or the like. The substrate processing apparatus control device 1700 may be configured to (based on, for example, the processor 1720 executing a program of instructions stored at the memory 1730) cause one or more operations of any of the methods of the example embodiments to be performed based on generating one or more command signals and transmitting the command signals to one or more of the actuators, gas flow control valves, heaters, plasma generation devices, one or more additional devices or the like of the communicatively coupled substrate processing apparatus to cause the substrate processing apparatus to cause the one or more operations to be performed based on operation of the one or more of the actuators, gas flow control valves, heaters, one or more additional devices in response to the one or more command signals.

As described herein, any devices, systems, blocks, modules, units, controllers, circuits, apparatus, and/or portions thereof according to any of some example embodiments (including, without limitation, any of the example embodiments of a substrate processing apparatus, the substrate processing apparatus control device 1700, any portion thereof, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, systems, blocks, modules, units, controllers, circuits, apparatuses, and/or portions thereof according to any of some example embodiments, and/or any portions thereof, including for example some or all operations of any of the methods shown in FIGS. 1, 2, 3, 10, 11-16, or any combination thereof.

It will be understood that, in some example embodiments, a semiconductor device manufactured according to any of the example embodiments may be incorporated into an electronic device having similar structure as the substrate processing apparatus control device 1700 shown in FIG. 17 (e.g., an electronic device, including a processor 1720, memory 1730, and/or interface 1740 communicatively coupled via a bus 1710 may include a semiconductor device manufactured according to any of the example embodiments, including semiconductor device 200, in any of the processor 1720, memory 1730, and/or interface 1740).

While example embodiments have been illustrated and described above, it will be apparent to those skilled in the art that modifications and variations could be made without departing from the scope of the present inventive concepts as defined by the appended claims.

What is claimed is:

1. A substrate processing apparatus, comprising:
a substrate support configured to support a plurality of substrates such that the plurality of substrates is on the substrate support;

a chamber sidewall surrounding at least a side surface of the substrate support; and an upper plate including a plurality of plate portions on the substrate support and spaced apart from the substrate support, wherein the plurality of plate portions and the substrate support collectively at least partially define a plurality of process regions between the plurality of plate portions and the substrate support, and the plurality of plate portions and the substrate support collectively at least partially define a separation region between at least two process regions of the plurality of process regions, wherein the plurality of plate portions include a first pretreatment process plate portion and a first deposition process plate portion, wherein the plurality of plate portions and the substrate support collectively at least partially define the plurality of process regions to include a first pretreatment process region between the first pretreatment process plate portion and the substrate support, the first pretreatment process region having a first height, and a first deposition process region between the first deposition process plate portion and the substrate support, the first deposition process region having a second height, the second height greater than the first height, wherein the first pretreatment process plate portion includes a pretreatment process gas nozzle configured to inject a pretreatment process gas to pre-treat a first substrate of the plurality of substrates on the substrate support in the first pretreatment process region, wherein the first deposition process plate portion includes a first deposition process gas nozzle configured to inject a deposition process gas to deposit a material layer on a second substrate of the plurality of substrates on the substrate support in the first deposition process region, wherein the chamber sidewall includes a second deposition process gas nozzle configured to inject the deposition process gas toward an upper region of the first deposition process region, and wherein the second deposition process gas nozzle is higher than a middle of the first deposition process region that is between an upper end of the first deposition process region and a lower end of the first deposition process region, and closer to the upper end of the first deposition process region than the middle of the first deposition process region.

2. The substrate processing apparatus of claim 1, further comprising:

a heating member, wherein the plurality of plate portions further include a first annealing process plate portion, wherein the plurality of process regions further include a first annealing process region that is at least partially defined between opposing surfaces of the first annealing process plate portion and the substrate support, wherein the first annealing process region has a height between the opposing surfaces of the first annealing process plate portion and the substrate support that is smaller than the second height, and wherein the heating member is configured to heat a third substrate of the plurality of substrates on the substrate support in the first annealing process region.

3. The substrate processing apparatus of claim 2, wherein the heating member includes a lamp.

4. The substrate processing apparatus of claim 2, wherein the plurality of plate portions further include a second pretreatment process plate portion, a second annealing process plate portion, and a second deposition process plate portion, the plurality of process regions further include a second pretreatment process region, a second deposition process region, and a second annealing process region, the second pretreatment process region is at least partially defined between opposing surfaces of the second pretreatment process plate portion and the substrate support, wherein the second pretreatment process region has a same size as the first pretreatment process region, the second deposition process region is at least partially defined between opposing surfaces of the second deposition process plate portion and the substrate support, wherein the second deposition process region has a same size as the first deposition process region, the second annealing process region is at least partially defined between opposing surfaces of the second annealing process plate portion and the substrate support, wherein the second annealing process region has a same size as the first annealing process region, the second deposition process plate portion has a same structure as the first deposition process plate portion, the second pretreatment process plate portion has a same structure as the first pretreatment process plate portion, and the second annealing process plate portion has a same structure as the first annealing process plate portion.

5. The substrate processing apparatus of claim 4, wherein, based on a center of the substrate support from a top view, the first annealing process region, the first pretreatment process region, the first deposition process region, the second annealing process region, the second pretreatment process region and the second deposition process region are sequentially arranged in a clockwise direction, the first annealing process region and the second annealing process region have mirror-symmetric structures, the first pretreatment process region and the second pretreatment process region have mirror-symmetric structures, and the first deposition process region and the second deposition process region have mirror-symmetric structures.

6. The substrate processing apparatus of claim 5, wherein from the top view, the plurality of process regions are spaced apart from each other, and the separation region is between the plurality of process regions.

7. The substrate processing apparatus of claim 1, wherein the upper plate includes a separation gas nozzle configured to inject a purge gas toward the separation region.

8. The substrate processing apparatus of claim 1, further comprising an external gas outlet between the substrate support and the chamber sidewall.

9. The substrate processing apparatus of claim 8, wherein from a top view, the substrate support has a circular shape, and the substrate support further includes a central gas outlet in a central region of the substrate support.

10. The substrate processing apparatus of claim 1, wherein the second height is equal to or greater than about twice the first height, and the second height is equal to or less than about twenty times the first height.

11. The substrate processing apparatus of claim 1, wherein the substrate support includes two or more heaters under the plurality of substrates on the substrate support.

12. A substrate processing apparatus, comprising:
a substrate support configured to support a plurality of substrates such that the plurality of substrates is on the substrate support;
a chamber sidewall surrounding at least a side surface of the substrate support; and
an upper plate including a pretreatment process plate portion and a deposition process plate portion, wherein the upper plate is on the substrate support and spaced apart from the substrate support, wherein
the upper plate and the substrate support collectively at least partially define a plurality of process regions between the upper plate and the substrate support, and
the upper plate and the substrate support collectively at least partially define a separation region between at least two process regions of the plurality of process regions,
wherein the upper plate and the substrate support collectively at least partially define the plurality of process regions to include
a pretreatment process region between the pretreatment process plate portion and the substrate support, the pretreatment process region having a first height, and
a deposition process region between the deposition process plate portion and the substrate support, the deposition process region having a second height, the second height greater than the first height,
wherein the first height is in a range of about 10 mm to about 50 mm,
wherein the second height is in a range of about 100 mm to about 200 mm,
wherein the deposition process plate portion includes a first deposition process gas nozzle configured to inject a deposition process gas in the deposition process region,
wherein the chamber sidewall includes a second deposition process gas nozzle configured to inject the deposition process gas toward an upper region of the deposition process region, and
wherein the second deposition process gas nozzle is higher than a middle of the deposition process region, between an upper end of the deposition process region and a lower end of the deposition process region, and closer to the upper end of the deposition process region than the middle of the deposition process region.
13. The substrate processing apparatus of claim 12, wherein
the upper plate further includes an annealing process plate portion spaced apart from the substrate support,
the upper plate and the substrate support collectively at least partially define the plurality of process regions to further include an annealing process region that is between the annealing process plate portion and the substrate support,
the annealing process region has a height less than the second height,
the pretreatment process region is between the annealing process region and the deposition process region,
the pretreatment process plate portion includes a pretreatment process gas nozzle configured to inject a pretreatment process gas to pre-treat a first substrate of the plurality of substrates on the substrate support in the pretreatment process region,
the deposition process plate portion includes a deposition process gas nozzle configured to inject a deposition process gas to deposit a material layer on a second substrate of the plurality of substrates on the substrate support in the deposition process region, and
the upper plate includes a separation gas nozzle configured to inject a purge gas toward the separation region.
14. A substrate processing apparatus, comprising:
a substrate support configured to support a plurality of substrates such that the plurality of substrates is on the substrate support;
a chamber sidewall surrounding at least a side surface of the substrate support; and
an upper plate including a plurality of plate portions on the substrate support and spaced apart from the substrate support, wherein
the plurality of plate portions and the substrate support collectively at least partially define a plurality of process regions between the plurality of plate portions and the substrate support, and
the plurality of plate portions and the substrate support collectively at least partially define a separation region between at least two process regions of the plurality of process regions,
wherein the plurality of plate portions include a first pretreatment process plate portion and a first deposition process plate portion,
wherein the plurality of plate portions and the substrate support collectively at least partially define the plurality of process regions to include
a first pretreatment process region between the first pretreatment process plate portion and the substrate support, the first pretreatment process region having a first height, and
a first deposition process region between the first deposition process plate portion and the substrate support, the first deposition process region having a second height, the second height greater than the first height,
wherein the first pretreatment process plate portion includes a pretreatment process gas nozzle configured to inject a pretreatment process gas to pre-treat a first substrate of the plurality of substrates on the substrate support in the first pretreatment process region,
wherein the first deposition process plate portion includes a first deposition process gas nozzle configured to inject a deposition process gas to deposit a material layer on a second substrate of the plurality of substrates on the substrate support in the first deposition process region,
wherein the plurality of process regions and the separation region are fluidly communicated with each other,
wherein the upper plate further includes a plurality of separation gas nozzles configured to inject a purge gas toward the separation region, and
wherein, when viewed with respect to an upper surface of the substrate support, a lower surface of a plate portion defining the separation region is disposed at a lower level than a lower surface of the first deposition process plate portion.
15. The substrate processing apparatus of claim 14, wherein the separation region includes a first region disposed at a central portion of the substrate support and second regions extending from the first region toward the chamber sidewall between adjacent ones of the plurality of process regions.
16. The substrate processing apparatus of claim 15, wherein each of the second regions has a width that increases in a direction from the first region toward the chamber sidewall.

17. The substrate processing apparatus of claim 14, wherein the substrate support further includes a central gas exhaust disposed in a central region thereof.

18. The substrate processing apparatus of claim 14, wherein the chamber sidewall includes a second deposition process gas nozzle configured to inject the deposition process gas toward an upper region of the first deposition process region, and the second deposition process gas nozzle is higher than a middle of the first deposition process region, between an upper end of the first deposition process region and a lower end of the first deposition process region, and closer to the upper end of the first deposition process region than the middle of the first deposition process region.

\* \* \* \* \*